United States Patent
Zhao et al.

(10) Patent No.: US 8,374,028 B2
(45) Date of Patent: Feb. 12, 2013

(54) SENSE OPERATION IN A MEMORY DEVICE

(75) Inventors: Yijie Zhao, Boise, ID (US); Akira Goda, Boise, ID (US); Mark A. Helm, Santa Cruz, CA (US)

(73) Assignee: Micron Technology, Inc., Boise, ID (US)

( * ) Notice: Subject to any disclaimer, the term of this patent is extended or adjusted under 35 U.S.C. 154(b) by 206 days.

(21) Appl. No.: 13/009,540

(22) Filed: Jan. 19, 2011

(65) Prior Publication Data
US 2012/0182797 A1 Jul. 19, 2012

(51) Int. Cl.
*G11C 16/00* (2006.01)
(52) U.S. Cl. ......... 365/185.03; 365/185.02; 365/185.18; 365/185.21
(58) Field of Classification Search ............... 365/185.02
See application file for complete search history.

(56) References Cited

U.S. PATENT DOCUMENTS

| 6,226,213 | B1 | 5/2001 | Chih |
| 7,321,510 | B2* | 1/2008 | Li et al. ........................ 365/185.1 |
| 7,372,730 | B2* | 5/2008 | Chen ........................ 365/185.02 |
| 7,583,540 | B2 | 9/2009 | Park et al. |
| 7,684,237 | B2* | 3/2010 | Moschiano et al. ..... 365/185.02 |
| 2010/0039860 | A1 | 2/2010 | Ruby et al. |
| 2010/0165738 | A1 | 7/2010 | Cernea |

* cited by examiner

*Primary Examiner* — Tan T. Nguyen
(74) *Attorney, Agent, or Firm* — Leffert Jay & Polglaze, P.A.

(57) ABSTRACT

Methods for sensing and memory devices are disclosed. One such method for sensing determines a threshold voltage of an n-bit memory cell that is adjacent to an m-bit memory cell to be sensed. A control gate of the m-bit memory cell to be sensed is biased with a sense voltage adjusted responsive to the determined threshold voltage of the n-bit memory cell.

22 Claims, 5 Drawing Sheets

|  | $WL_{n-2}$ | $WL_{n-1}$ | $WL_n$ | $WL_{n+1}$ | $WL_{n+2}$ |
|---|---|---|---|---|---|
| $BL_{n-1}$ | Page k-1 | Page k-3 | Page k+5 | Page k+3 | Page k+11 |
|  | Page k-2 |  | Page k+4 |  | Page k+10 |
| $BL_n$ | Page k-4 | Page k+2 | Page k | Page k+8 | Page k+6 |
|  |  | Page k+1 |  | Page k+7 |  |
| $BL_{n+1}$ | Page k-1 | Page k-3 | Page k+5 | Page k+3 | Page k+11 |
|  | Page k-2 |  | Page k+4 |  | Page k+10 |

SENSE OPERATION IN A MEMORY DEVICE

TECHNICAL FIELD

The present invention relates generally to memory and a particular embodiment relates to compensation of sense voltages in non-volatile memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A flash memory is a type of memory that can be erased and reprogrammed in blocks instead of one byte at a time. A typical flash memory comprises a memory array, which includes a large number of memory cells. Changes in threshold voltage of the memory cells, through programming of charge storage structures (e.g., floating gates or charge traps) or other physical phenomena (e.g., phase change or polarization), determine the data value of each cell. The cells are usually grouped into blocks. Each of the cells within a block can be electrically programmed, such as by charging the charge storage structure. The data in a cell of this type is determined by the presence or absence of the charge in the charge storage structure. The charge can be removed from the charge storage structure by an erase operation.

Each memory cell can be programmed, for example, as a single bit cell (i.e., single level cell—SLC) or a multiple bit cell (i.e., multilevel cell—MLC). Each cell's threshold voltage ($V_t$) is representative of the data that is stored in the cell. For example, in a single bit cell, a $V_t$ of 1.5V can indicate a programmed cell while a $V_t$ of −0.5V might indicate an erased cell.

A multilevel cell has multiple $V_t$ ranges that each represents a different state. Multilevel cells can take advantage of the analog nature of a traditional flash cell by assigning a bit pattern to a specific $V_t$ range for the cell. This technology permits the storage of data values representing n bits (e.g., two or more bits) per cell, depending on the quantity of $V_t$ ranges assigned to the cell.

As the size of memory cells has decreased in order to increase the density of memory devices, the resulting proximity of the memory cells can cause problems with capacitive coupling. For example, floating gate-to-floating gate capacitive coupling between adjacent memory cells can cause the programming of one memory cell to "pull-up" an already programmed memory cell to a higher threshold voltage. This coupling can result in errors reading the affected memory cell since its threshold voltage can be increased beyond a normal read voltage for a particular programmed state.

For the reasons stated above, and for other reasons stated below that will become apparent to those skilled in the art upon reading and understanding the present specification, there is a need in the art to reduce the effects of, for example, charge storage structure to charge storage structure coupling.

DETAILED DESCRIPTION

Figure 1:
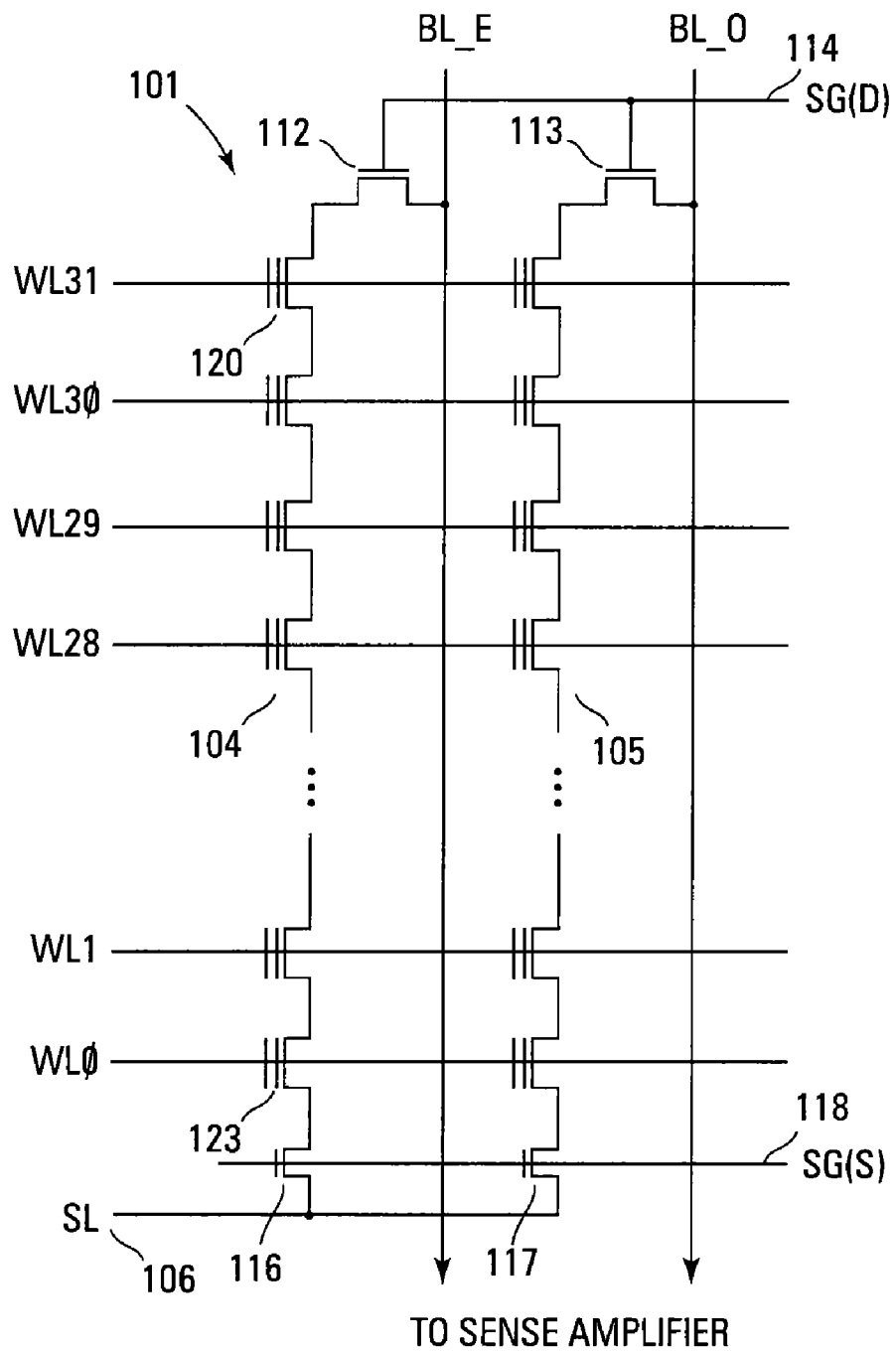
FIG. 1 shows schematic diagram of one embodiment of a portion of a memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of one embodiment of a portion of the NAND architecture memory array 101, as illustrated in FIG. 1, comprising series strings of non-volatile memory cells. The present embodiments of the memory array are not limited to the illustrated NAND architecture. Alternate embodiments can use NOR or other architectures as well.

The memory array 101 comprises an array of non-volatile memory cells (e.g., floating gate) arranged in columns such as series strings 104, 105. Each of the cells is coupled drain to source in each series string 104, 105. An access line (e.g. word line) WL0-WL31 that spans across multiple series strings 104, 105 is coupled to (and in some cases at least partially formed by) the control gates of each memory cell in a row in order to bias the control gates of the memory cells in the row. Data lines, such as even/odd bit lines BL_E, BL_O, are coupled to the series strings and eventually coupled to sense circuitry that detect the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

The memory cell array of FIG. 1 can be organized as erase blocks of memory cells and each erase block can be organized as pages of memory cells. An erase block might be 64 pages of single level cell data and 128 pages of multilevel cell data while each page might be comprised of 2048 bytes of data on 32 word lines.

Figures 2, 4:
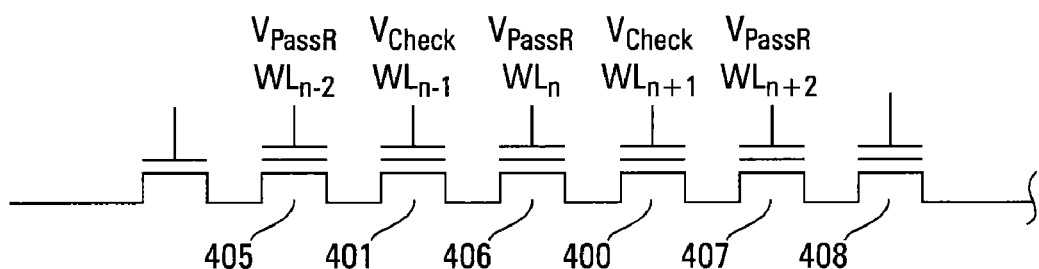
FIG. 2 shows a diagram of one embodiment of a programming pattern for a memory array.
FIG. 4 shows a word line biasing scheme in accordance with the embodiment of FIG. 3.

FIG. 2 illustrates a diagram of one embodiment of a programming pattern for a memory array. The programming pattern is a checkerboard pattern for an m-bit per cell/n-bit per cell memory architecture that can reduce, for example, floating gate-to-floating gate coupling.

In the illustrated embodiment, each cell that can be programmed as an n-bit cell is shown programmed as a two-bit cell (e.g., two page cell) and each cell that can be programmed as an m-bit cell is shown programmed as a one-bit cell (e.g., one page cell), which is often referred to as an SLC. However, this is only for purposes of illustration since the memory cells can be programmed with any number of bits (including, for example, a non-integer number of bits).

The memory array is arranged such that the memory cells coupled to word lines WLn, WLn±1, and WLn±2 are shown extending vertically. The memory cells coupled to bit lines BLn and BLn±1 are shown extending horizontally.

FIG. 2 shows that every other memory cell on either each word line or each bit line is a 1-bit cell. Thus, the n-bit memory cells are separated from each other by an adjacent m-bit cell, where m is less than n. For example, assuming that the memory cell coupled to both WLn and BLn is programmed with page k, WLn is coupled to memory cells that are programmed with pages k+4 and k+5 on BLn−1, page k on BLn, and pages k+4 and k+5 on BLn+1. WLn+1 is coupled to memory cells that are programmed with page k+3 on BLn−1, pages k+7 and k+8 on BLn, and page k+3 on BLn+1. WLn−1 is coupled to memory cells that are programmed with page k−3 on BLn−1, pages k+2 and k+1 on BLn, and page k−3 on BLn+1. WLn+2 is coupled to memory cells that are programmed with pages k+11 and k+10 on BLn−1, page k+6 on BLn, and pages k+11 and k+10 on BLn+1. WLn−2 is coupled to memory cells that are programmed with pages k−1 and k−2 on BLn−1, page k−4 on BLn, and pages k−1 and k−2 on BLn+1. This pattern can be repeated throughout the memory block, other memory cell groupings, or the entire memory array.

During a programming operation, the m-bit cell cells of a memory block are programmed prior to respective adjacent n-bit cells. While the programming of memory cells as m-bit cells reduces the density of a memory device (as compared to programming all of the cells as n-bit cells), the coupling of the n-bit cells can be reduced by the intervening m-bit cells. Additionally, the density can be increased by programming a greater number of bits n to the n-bit cells, such as by programming three or more bits to the n-bit cells.

The following embodiments describe a sense operation on non-volatile memory cells, such as those illustrated in FIG. 1. A sense operation can include such operations as a memory read operation for reading data from a memory cell and a program verify operation that verifies the accuracy of programming target data to a memory cell.

The following embodiments additionally describe the biasing of the word lines in order to bias the individual memory cells coupled to that particular word line. Since the control gates of the memory cells are coupled in rows to a particular word line, biasing a particular word line also biases those memory cells whose control gates are coupled to that particular word line.

Figures 3, 5:
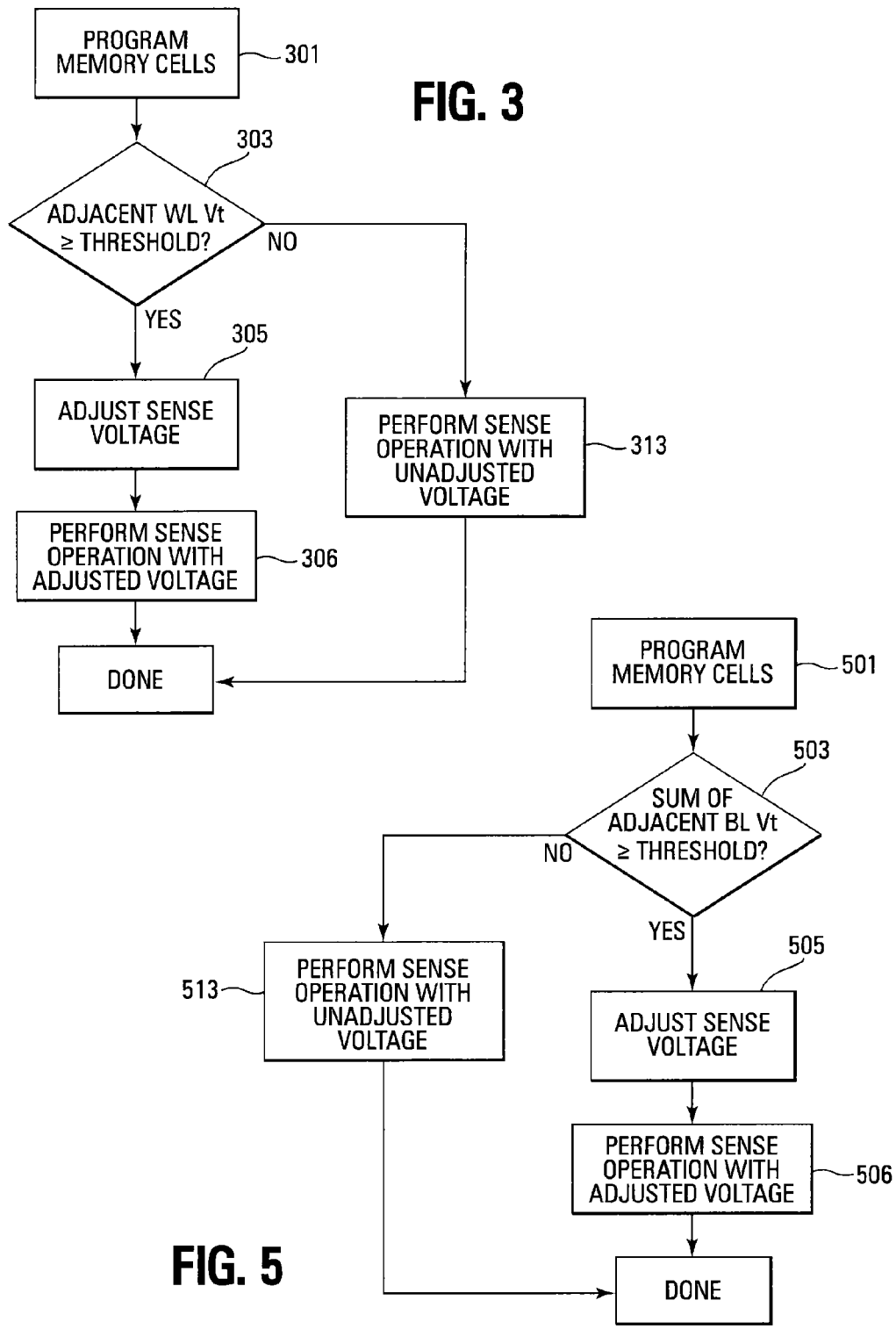
FIG. 3 shows a flowchart of one embodiment of a method for sensing a memory.
FIG. 5 shows a flowchart of an alternate embodiment of a method for sensing a memory.

FIG. 3 illustrates a flowchart of one embodiment of a method for sensing memory cells. The method of FIG. 3 checks threshold voltages of n-bit memory cells adjacent to a selected m-bit memory cell, such as those that are coupled to word lines (e.g., WLn±1) adjacent to a selected word line (e.g., WLn) to determine if a sense voltage for the selected m-bit cell needs to be adjusted. In one such embodiment, both of the n-bit cells adjacent to a selected m-bit cell (that are coupled to a same bit line, such as BLn) are checked at substantially the same (in other words, WLn+/−1 are checked together, such as in a single check operation). For example, if the threshold voltage of either (or both) the n-bit cell coupled to WLn−1 or the n-bit cell coupled to WLn+1 is greater than or equal to a threshold (where both of those n-bit cells are adjacent to a selected m-bit cell), then a sense voltage for the selected m-bit cell is adjusted. In one further embodiment, sense voltages for the n-bit cells are not adjusted in a similar manner. For example, in one such embodiment, the n-bit cells are not substantially affected by, for example, floating gate to floating gate coupling with the m-bit cells, and therefore it is not necessary to adjust the sense voltages for the n-bit cells (at least with respect to, for example, floating gate to floating gate coupling).

The memory cells to be sensed are initially programmed 301. In one embodiment, the memory cells are programmed in the pattern illustrated in FIG. 2, wherein each m-bit cell is programmed before any of its respective adjacent (e.g., surrounding) n-bit cells are programmed. The threshold voltages of memory cells coupled to adjacent word lines (e.g., WLn±1) are checked to determine if either threshold voltage is greater than or equal to a particular threshold (e.g., $V_{CHECK}$, which might be, for example, 4V) 303. In some embodiments, the threshold voltages are directly determined. In other embodiments, the threshold voltages can be logically determined (e.g., such as by considering to what state the adjacent n-bit cells were to be programmed or to which they have been programmed).

If the threshold voltages of adjacent n-bit memory cells coupled to both adjacent word lines are less than the particular threshold, the sense operation is performed with an unadjusted sense voltage applied to a control gate of the selected m-bit memory cell 313 on word line WLn. In this case, the adjacent n-bit memory cells on the adjacent word lines WLn±1 have not been programmed to a threshold voltage that is greater than or equal to the particular threshold and, thus, the selected m-bit cell would not need an adjusted sense voltage since the floating gate-to-floating gate coupling should be minimal or non-existent.

If the threshold voltages of the n-bit memory cells coupled to either adjacent word line are greater than or equal to the particular threshold, the sense voltage for the selected word line (e.g., WLn) is adjusted 305 by some particular offset voltage (e.g., 0.3V). This offset voltage compensates for the word line-to-word line coupling caused by the higher threshold voltages. A sense operation can then be performed using the adjusted sense voltage 306.

FIG. 4 illustrates a word line biasing scheme of a partial series string of memory cells in accordance with the embodiment of FIG. 3. In this embodiment, the adjacent word lines WLn+1 400 and WLn−1 401 are biased at a check voltage $V_{CHECK}$ (e.g., 4V) while the other word lines 405-408 of the series string are biased at a read pass voltage $V_{PASSR}$ (e.g., 5V-6V). If the threshold voltage of either (or both) of the memory cells coupled to the adjacent word lines is greater than or equal to $V_{CHECK}$, no current will flow in the selected bit lines. If the threshold voltages of both of the memory cells coupled to the adjacent word lines are less than $V_{CHECK}$, current flows in the selected bit line.

In one embodiment, the $V_{CHECK}$ voltage can be applied to the adjacent word lines substantially simultaneously. In an alternate embodiment, the $V_{CHECK}$ voltage can be applied to the adjacent word lines at different times.

FIG. 5 illustrates a flowchart of an alternate embodiment of a method for sensing memory cells. This embodiment checks threshold voltages of adjacent n-bit memory cells coupled to adjacent bit lines (e.g., BLn±1) to determine if a sense voltage of a selected m-bit memory cell needs to be adjusted.

After the memory cells are initially programmed 501, such as where each m-bit cell is programmed before the respective adjacent (e.g., surrounding) n-bit cells are programmed, the threshold voltages of adjacent n-bit memory cells coupled to adjacent bit lines (e.g., BLn±1) are sensed. If the sum of these threshold voltages is less than a particular threshold 503, the sense operation is performed with an unadjusted sense voltage applied to the control gate of the selected m-bit memory cell 513.

If the sum of these threshold voltages is greater than or equal to the particular threshold 503, the sense voltage is adjusted by an offset voltage 505. The sense operation on the selected m-bit memory cell is performed with a sense voltage adjusted by a particular offset voltage (e.g., 0.3V) 506, such as in order to compensate for bit line-to-bit line coupling. The bit line sense operation performed on the adjacent bit lines can be performed substantially simultaneously or at different times.

Figure 6:
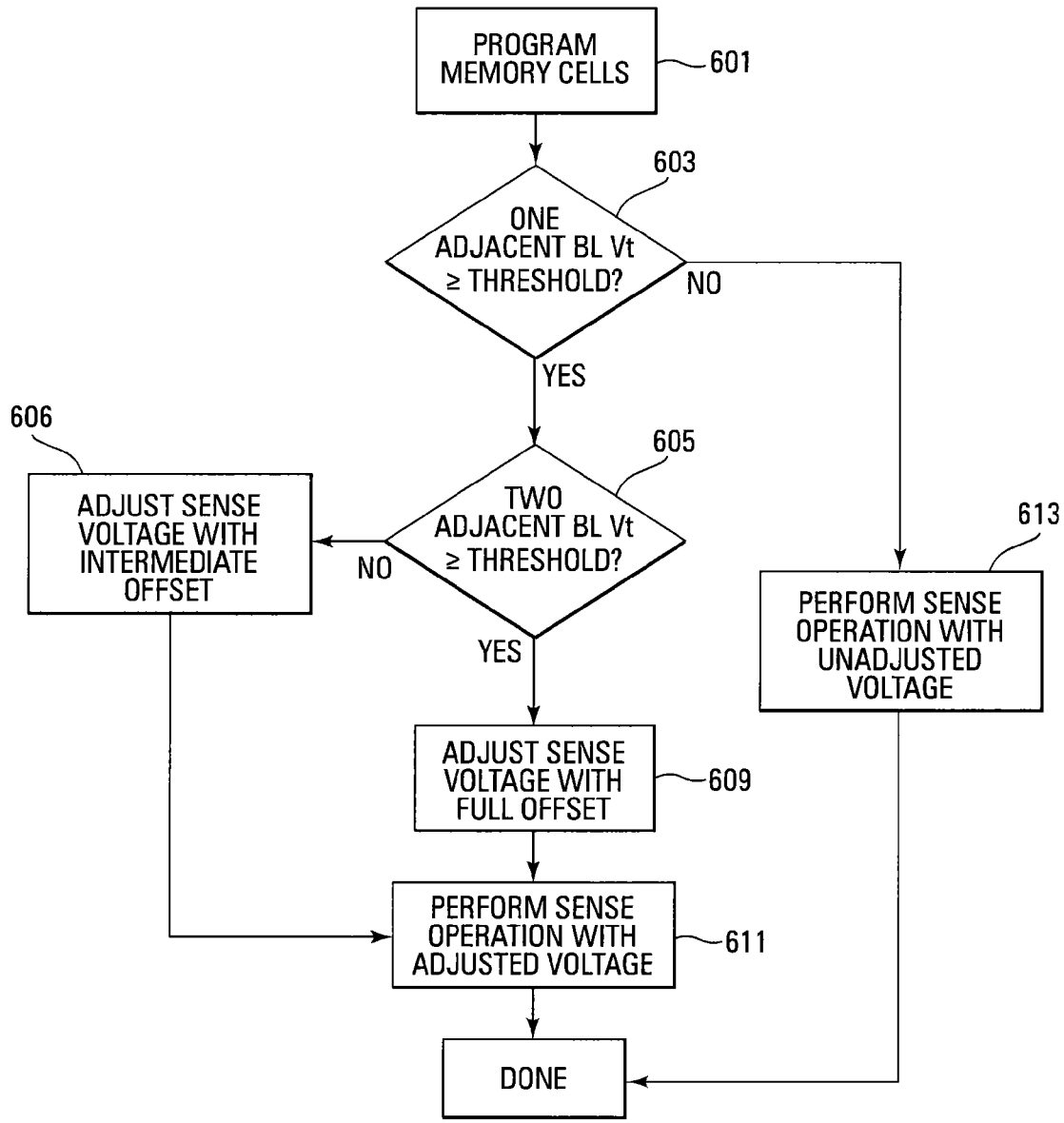
FIG. 6 shows a flowchart of another alternate embodiment of a method for sensing a memory.

FIG. 6 illustrates a flowchart of another alternate embodiment of the method for sensing a memory. In this embodiment, the offset voltage is different depending on the threshold voltages determined for each adjacent n-bit memory cell on each adjacent bit line.

After the memory cells are programmed 601, the threshold voltages of the adjacent n-bit memory cells coupled to bit lines adjacent to the selected m-bit memory cell are sensed. If neither adjacent n-bit memory cell has a threshold voltage greater than or equal to a particular threshold 603, the sense operation is performed with an unadjusted sense voltage applied to the control gate of the selected m-bit memory cell 613.

If only one of the n-bit memory cells of an adjacent bit line has a threshold voltage greater than or equal to the particular threshold 603, the offset voltage is some intermediate offset voltage (e.g., 0.2V). This intermediate offset voltage is added to the initial sense voltage 606 and the resulting adjusted sense voltage is applied to the control gate of the selected m-bit memory cell to perform the sense operation 611.

If both of the n-bit memory cells of the adjacent bit lines have threshold voltages greater than or equal to the particular threshold 605, the offset voltage is some full offset voltage (e.g., 0.4V) that is greater than the intermediate offset voltage. The full offset voltage is added to the initial sense voltage 609 and the resulting adjusted sense voltage is applied to the control gate of the selected m-bit memory cell to perform the sense operation 611.

Figure 7:
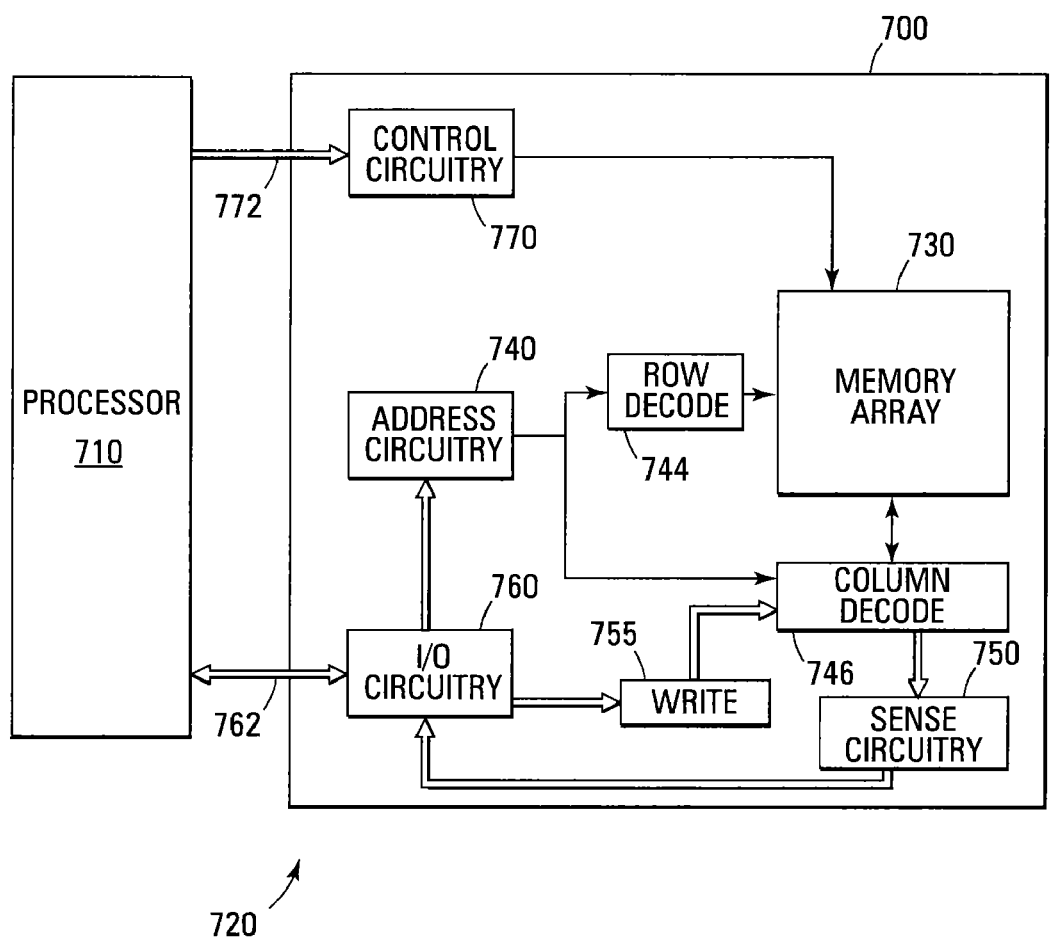
FIG. 7 shows a block diagram of one embodiment of a memory system that can incorporate the embodiments for sensing.

FIG. 7 illustrates a functional block diagram of a memory device 700. The memory device 700 is coupled to an external controller 710. The controller 710 may be a microprocessor or some other type of controlling circuitry. The memory device 700 and the controller 710 form part of a memory system 720. The memory device 700 has been simplified to focus on features of the memory that are helpful in understanding the present invention.

The memory device 700 includes an array 730 of non-volatile memory cells, such as the one illustrated previously in FIG. 1. The memory array 730 is arranged in banks of word line rows and bit line columns. In one embodiment, the columns of the memory array 730 are comprised of series strings of memory cells as illustrated in FIG. 1. As is well known in the art, the connections of the cells to the bit lines determines whether the array is a NAND architecture, an AND architecture, or a NOR architecture.

Address buffer circuitry 740 is provided to latch address signals provided through the I/O circuitry 760. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense circuitry. The sense circuitry 750, in one embodiment, is coupled to read and latch a row of data from the memory array 730. Data input and output buffer circuitry 760 is included for bidirectional data communication as well as address communication over a plurality of data connections 762 with the controller 710. Write circuitry 755 is provided to write data to the memory array.

Memory control circuitry 770 decodes signals provided on control connections 772 from the external controller 710. These signals are used to control the operations on the memory array 730, including data read, data write (program), and erase operations. The memory control circuitry 770 may be a state machine, a sequencer, or some other type of control circuitry to generate the memory control signals. In one embodiment, the memory control circuitry 770 is configured to control generation of memory control signals that include execution of the embodiments of the sense operation of the present disclosure.

The flash memory device illustrated in FIG. 7 has been simplified to facilitate a basic understanding of the features of the memory. A more detailed understanding of internal circuitry and functions of flash memories are known to those skilled in the art.

CONCLUSION

In summary, one or more embodiments of the sense methods can provide charge storage structure (e.g., floating gate) to charge storage structure compensation by adjusting a sense voltage for a selected m-bit memory cell in response to threshold voltages of m-bit memory cells coupled to adjacent word lines and/or adjacent bit lines. By determining whether the threshold voltage of the adjacent n-bit memory cells is greater than or equal to a particular threshold, a sense voltage offset can be determined.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is intended that this invention be limited only by the following claims and equivalents thereof.

What is claimed is:

1. A method for sensing a selected m-bit memory cell, the method comprising:
    determining a threshold voltage of an n-bit memory cell that is adjacent to the selected m-bit memory cell, wherein m is less than n; and
    biasing a control gate of the selected memory cell with a sense voltage adjusted responsive to the determined threshold voltage.

2. The method of claim 1 wherein the sense voltage adjusted responsive to the determined threshold voltage comprises an initial sense voltage plus an offset voltage determined responsive to the threshold voltages of the adjacent n-bit memory cell.

3. The method of claim 2 wherein the offset voltage is 0V when the threshold voltage of the adjacent n-bit memory cell is less than a particular threshold.

4. The method of claim 2 wherein the offset voltage is greater than 0V when the threshold voltage of the adjacent n-bit memory cell is greater than or equal to a particular threshold.

5. The method of claim 2 wherein determining a threshold voltage comprises determining threshold voltages of n-bit memory cells that are adjacent to the selected m-bit memory cell and are coupled to a same access line as the selected m-bit memory cell, the offset voltage is an intermediate offset voltage that is greater than 0V when only one of the adjacent memory cells is greater than or equal to a particular threshold.

6. The method of claim 5 wherein the offset voltage is a full offset voltage that is greater than the intermediate offset voltage when the adjacent memory cells have threshold voltages greater than or equal to the particular threshold.

7. The method of claim 1 wherein the m-bit memory cell was programmed before the n-bit memory cell.

8. The method of claim 1 wherein the n-bit memory cell and the m-bit cell are coupled to a same data line.

9. The method of claim 1 wherein the n-bit memory cell and the m-bit memory cell are coupled to a same access line.

10. The method of claim 1 wherein determining the threshold voltage comprises determining at substantially the same time whether threshold voltages of n-bit memory cells that are adjacent to the selected m-bit memory cell are greater than or equal to a threshold.

11. A method for sensing a selected m-bit memory cell, the method comprising:
   determining threshold voltages of n-bit memory cells that are adjacent to the selected m-bit memory cell, wherein m is less than n; and
   adjusting a sense voltage for the selected m-bit memory cell when the threshold voltage of at least one of the adjacent n-bit memory cells is greater than or equal to a particular threshold.

12. The method of claim 11 and further comprising programming a group of memory cells, including the selected m-bit memory cell, in a pattern such that n-bit memory cells are not adjacent to m-bit memory cells.

13. The method of claim 12 wherein the group of memory cells is a memory block.

14. The method of claim 11 wherein the n-bit memory cells are coupled to a same data line as the selected m-bit memory cell.

15. The method of claim 14 wherein determining the threshold voltages of the adjacent memory cells comprises:
   biasing control gates of the n-bit memory cells with a check voltage; and
   biasing control gates of remaining memory cells in a series string of memory cells, with the selected m-bit memory cell and the n-bit memory cells that are adjacent to the selected m-bit memory cells and the selected memory cell, with a pass voltage wherein the pass voltage is greater than the check voltage.

16. A method for sensing a selected m-bit memory cell, the method comprising:
   determining threshold voltages of n-bit memory cells that are adjacent to the selected m-bit memory cell, wherein m is less than n and wherein the n-bit memory cells and the selected m-bit memory cell are coupled to a same access line; and
   adjusting a sense voltage for the m-bit memory cell when a sum of the threshold voltages of the adjacent n-bit memory cells is greater than or equal to a particular threshold.

17. A method for sensing a selected m-bit memory cell, the method comprising:
   determining threshold voltages of n-bit memory cells that are adjacent to the selected m-bit memory cell, wherein m is less than n and wherein the n-bit memory cells and the selected m-bit memory cell are coupled to a same access line;
   adjusting a sense voltage for the m-bit memory cell with a first offset voltage when only one of the n-bit memory cells has a threshold voltage greater than or equal to a particular threshold; and
   adjusting the sense voltage with a second offset voltage when more than one of the n-bit memory cells has a threshold voltage greater than or equal to the particular threshold.

18. The method of claim 17 wherein the second offset voltage is greater than the first offset voltage.

19. The method of claim 17 wherein the particular threshold is 4V.

20. The method of claim 17 and further including programming a group of memory cells including the selected m-bit memory cell and the n-bit memory cells such that memory cells alternate between m-bit memory cells and n-bit memory cells in both a data line direction and the access line direction.

21. A memory device comprising:
   an array of memory cells; and
   control circuitry coupled to the array of memory cells and configured to determine a threshold voltage of an n-bit memory cell that is adjacent to a selected m-bit memory cell, wherein m is less than n and bias a control gate of the selected memory cell with a sense voltage adjusted responsive to the determined threshold voltage.

22. The memory device of claim 21 wherein the control circuitry is also configured to program the m-bit memory cell before programming the n-bit memory cells.

* * * * *

UNITED STATES PATENT AND TRADEMARK OFFICE
CERTIFICATE OF CORRECTION

PATENT NO. : 8,374,028 B2
APPLICATION NO. : 13/009540
DATED : February 12, 2013
INVENTOR(S) : Yijie Zhao et al.

It is certified that error appears in the above-identified patent and that said Letters Patent is hereby corrected as shown below:

In the Claims:

In column 7, line 16, in Claim 8, after "m-bit" insert -- memory --.

Signed and Sealed this
Twenty-first Day of May, 2013

Teresa Stanek Rea
*Acting Director of the United States Patent and Trademark Office*